(12) United States Patent
Lee et al.

(10) Patent No.: US 7,250,788 B2
(45) Date of Patent: Jul. 31, 2007

(54) SHIFT REGISTER, GATE DRIVING CIRCUIT AND DISPLAY PANEL HAVING THE SAME, AND METHOD THEREOF

(75) Inventors: Myung-Woo Lee, Suwon-si (KR); Sang-Jin Pak, Yongin-si (KR); Joo-Hyung Lee, Gwacheon-si (KR); Hyung-Guel Kim, Yongin-si (KR); Man-Seung Cho, Seoul (KR); Kee-Han Uh, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 109 days.

(21) Appl. No.: 11/242,387

(22) Filed: Oct. 3, 2005

(65) Prior Publication Data

US 2006/0071923 A1    Apr. 6, 2006

(30) Foreign Application Priority Data

Oct. 1, 2004   (KR) .................... 10-2004-0078306

(51) Int. Cl.
*H03K 19/173*   (2006.01)
(52) U.S. Cl. ........................ 326/46; 326/93; 345/100
(58) Field of Classification Search ................. 326/38, 326/41, 46, 26, 27, 93; 345/100
See application file for complete search history.

(56) References Cited

U.S. PATENT DOCUMENTS

| | | | | |
|---|---|---|---|---|
| 6,834,095 B2* | 12/2004 | Yu | ............... | 377/71 |
| 6,904,115 B2* | 6/2005 | Lin | ............... | 377/53 |
| 7,050,036 B2* | 5/2006 | Kim et al. | .................. | 345/100 |
| 7,120,221 B2* | 10/2006 | Moon | ........................... | 377/64 |
| 2003/0128180 A1* | 7/2003 | Kim et al. | .................. | 345/100 |
| 2004/0227718 A1* | 11/2004 | Park | ............................ | 345/100 |

* cited by examiner

*Primary Examiner*—Don Le
(74) *Attorney, Agent, or Firm*—Cantor Colburn LLP

(57) ABSTRACT

A shift register includes a plurality of stages each generating an output signal in sequence and including a buffering section, a driving section, a first charging section, and a charging control section. The buffering section receives one of a scan start signal and an output signal of a previous stage so that the driving section generates the output signal of a present stage. The first charging section includes a first terminal electrically connected to the driving section and a second terminal electrically connected to a first source voltage. The charging control section applies the output signal of a next stage to the first charging section. Therefore, a gradual failure of TFT is reduced.

33 Claims, 14 Drawing Sheets

SHIFT REGISTER, GATE DRIVING CIRCUIT AND DISPLAY PANEL HAVING THE SAME, AND METHOD THEREOF

This application claims priority to Korean Patent Application No. 2004-78306, filed on Oct. 1, 2004 and all the benefits accruing therefrom under 35 U.S.C. §119, and the contents of which in its entirety are herein incorporated by reference.

BACKGROUND OF THE INVENTION

1. Field of the Invention

The present invention relates to a shift register, a gate driving circuit including the shift register, a display panel including the shift register, and a method thereof. More particularly, the present invention relates to a shift register capable of reducing a gradual failure of a thin film transistor ("TFT"), a gate driving circuit including the shift register, a display panel including the shift register, and a method of minimizing transistor failure in the shift register.

2. Description of the Related Art

Recently, in order to reduce a manufacturing cost and to slim down a bezel of a display device, where a bezel is the border around a display area of a display device, a data driving integrated circuit ("IC") or a gate driving IC is directly formed on the display panel. In order to form the gate driving IC on the display panel, simplifying a structure of the gate driving IC including an amorphous silicon a-Si thin film transistor ("TFT") is required.

According to a conventional shift register having the a-Si TFT, a voltage of a specific node is maintained in a low level by applying relatively high positive voltage to a gate electrode of the a-Si TFT. When, the relatively high positive voltage between gate and source electrodes Vgs is applied to the gate electrode of the a-Si TFT for a long time, a threshold voltage Vth of the a-Si TFT is shifted to be about 1V to about 15V to induce a malfunction or misoperation.

BRIEF SUMMARY OF THE INVENTION

The present invention provides a shift register capable of preventing an occurrence of a malfunction or misoperation.

The present invention also provides a gate driving circuit heaving the above-mentioned shift register.

The present invention also provides a display panel having the above-mentioned shift register.

In exemplary embodiments of a shift register according to the present invention, the shift register includes a plurality of stages. Each of the stages generates an output signal in sequence. Each of the stages includes a buffering section, a driving section, a first charging section, and a charging control section. The buffering section receives one of a scan start signal and an output signal of a previous stage. The driving section generates the output signal of a present stage, when the buffering section receives one of the scan start signal and the output signal of the previous stage. The first charging section includes a first terminal electrically connected to the driving section and a second terminal electrically connected to a first source voltage. The charging control section applies the output signal of a next stage to the first charging section.

In exemplary embodiments of a gate driving circuit according to the present invention, the gate driving circuit includes a plurality of stages. Each of the stages applies an output signal to gate lines in sequence. Each of the stages includes a buffering section, a driving section, a first charging section, and a charging control section. The buffering section receives one of a scan start signal and an output signal of a previous stage. The driving section generates the output signal of a present stage, when the buffering section receives one of the scan start signal and the output signal of the previous stage. The first charging section includes a first terminal electrically connected to the driving section and a second terminal electrically connected to a first source voltage. The charging control section applies the output signal of a next stage to the first charging section.

In exemplary embodiments of a display panel according to the present invention, the display panel includes a cell array circuit and a gate driving circuit. The cell array circuit is formed on a substrate. The cell array circuit includes a plurality of data lines and a plurality of gate lines. The gate driving circuit is formed on the substrate. The gate driving circuit includes a plurality of stages. Each of the stages applies an output signal to gate lines in sequence. Each of the stages includes a buffering section, a driving section, a first charging section, and a charging control section. The buffering section receives one of a scan start signal and an output signal of a previous stage. The driving section generates the output signal of a present stage, when the buffering section receives one of the scan start signal and the output signal of the previous stage. The first charging section includes a first terminal electrically connected to the driving section and a second terminal electrically connected to a first source voltage. The charging control section applies the output signal of a next stage to the first charging section.

In exemplary embodiments of a method of minimizing a gradual failure of a first transistor within a discharging section and a second transistor within a driving section of a unit stage of a shift register, the method includes connecting gate electrodes of the first and second transistors to a node, providing a charging control section with a plurality of sub transistors connected in series to each other, connecting a source electrode of a final sub transistor in the plurality of sub transistors within the charging control section to the node, providing a discharging control section with a plurality of sub transistors connected in series to each other, and connecting a d rain electrode of a first sub transistor in the plurality of sub transistors within the discharging control section to the node.

Therefore, a gradual failure of TFT is reduced.

BRIEF DESCRIPTION OF THE DRAWINGS

The above and other features and advantages of the present invention will become more apparent by describing in detailed exemplary embodiments thereof with reference to the accompanying drawings, in which.

DETAILED DESCRIPTION OF THE INVENTION

It should be understood that the exemplary embodiments of the present invention described below may be varied and modified in many different ways without departing from the inventive principles disclosed herein, and the scope of the present invention is therefore not limited to these particular following embodiments. Rather, these embodiments are provided so that this disclosure will be thorough and complete, and will fully convey the concept of the invention to those skilled in the art by way of example and not of limitation.

Hereinafter, the embodiments of the present invention will be described in detail with reference to the accompanied drawings. Like numerals refer to like elements throughout.

Figure 1:
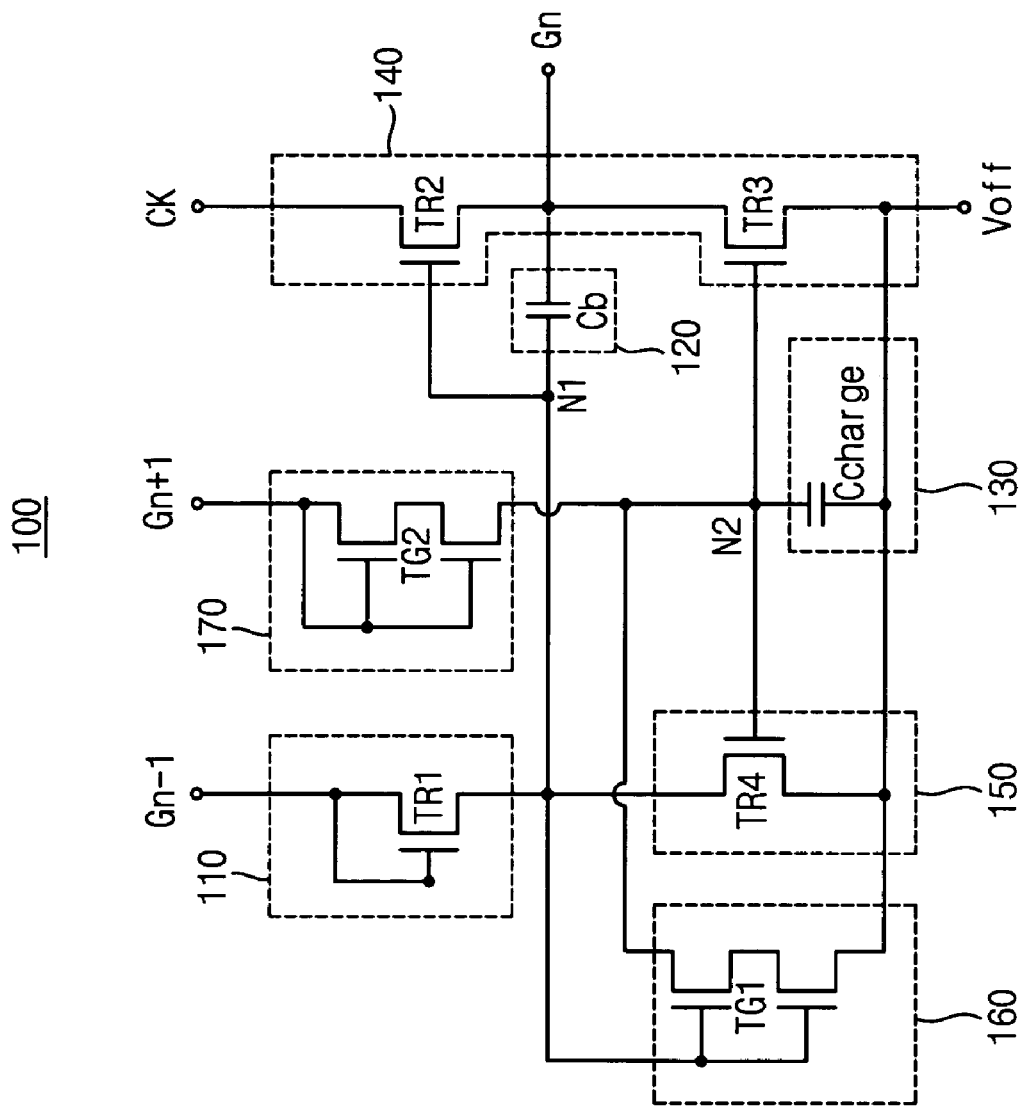
FIG. 1 is a circuit diagram illustrating an exemplary embodiment of a shift register according to the present invention.

FIG. 1 is a circuit diagram illustrating an exemplary embodiment of a shift register according to the present invention, and FIGS. 2A to 2I are timing charts illustrating signals in FIG. 1.

Referring to FIG. 1, a unit stage 100 of a shift register includes a buffering section 110, an output charging section 120, a source charging section 130, a driving section 140, a discharging section 150, a discharging control section 160, and a charging control section 170. The unit stage 100 outputs a gate signal (or scan signal) based on a scan start signal STV or an output signal Gn−1 of a previous stage received in the buffering section 110. In FIG. 1, the output signal of the previous stage is represented by 'Gn−1'. It should be understood that a shift register may include a plurality of stages 100.

The buffering section 110 includes a first transistor TR1. The first transistor TR1 includes a drain electrode, a gate electrode that is electrically connected to a first node N1. The first transistor TR1 receives the scan start signal STV or the output signal Gn−1 of a previous stage through the drain electrode.

The output charging section 120 includes an output capacitor Cb. The output capacitor Cb includes a first electrode electrically connected to the first node N1 and a second electrode electrically connected to an output terminal of the present stage that is electrically connected to an n-th gate line Gn. In FIG. 1, the output signal of the present stage is also represented by 'Gn'. A parasitic capacitor may be used as the output capacitor Cb.

The source charging section 130 includes a frame capacitor Ccharge. The frame capacitor Ccharge includes a first electrode electrically connected to a first source voltage VOFF and a second electrode electrically connected to the second node N2. The frame capacitor Ccharge has a capacitance for storing electrical charges for one frame. The frame capacitor Ccharge has, for example, a capacitance of about 1 pico-Farad pF.

The driving section 140 includes a second transistor TR2 and a third transistor TR3. The second transistor TR2 includes a gate electrode electrically connected to the first node N1, a source electrode electrically connected to the output terminal of the present stage that is electrically connected to an n-th gate line Gn, and a drain electrode electrically connected to a clock terminal CK. The third transistor TR3 includes a drain electrode electrically connected to the output terminal of the present stage that is electrically connected to an n-th gate line Gn, a gate electrode electrically connected to a second node N2, and a source electrode electrically connected to the first source voltage VOFF.

The discharging section 150 includes a fourth transistor TR4. The fourth transistor TR4 includes a drain electrode electrically connected to the first node N1, a gate electrode electrically connected to the second node N2, and a source electrode electrically connected to the first source voltage VOFF.

The discharging control section 160 includes a first transistor group TG1. The first transistor group TG1 includes a plurality of transistors connected in series. While the first transistor group TG1 may include more than two sub transistors, as illustrated, the first transistor group TG1 includes a first sub transistor and a second sub transistor. A drain electrode of the first sub transistor of the first transistor group TG1 is electrically connected to the second node N2. A source electrode of the first sub transistor is electrically connected to a drain electrode of the second sub transistor. A source electrode of the second sub transistor is electrically connected to the first source voltage VOFF. Gate electrodes of the first and second sub transistors of the first transistor group TG1 are electrically connected to each other and to the first node N1.

The charging control section 170 includes a second transistor group TG2. The second transistor group TG2 includes a plurality of transistors connected in series. While the second transistor group TG2 may include more than two sub transistors, as illustrated, the second transistor group TG2 includes a first sub transistor and a second sub transistor. A drain electrode of the first sub transistor is electrically connected to the output signal of a next stage Gn+1. A source electrode of the first sub transistor is electrically connected to a drain electrode of the second sub transistor. A source electrode of the second sub transistor is electrically connected to the second node N2. Gate electrodes of the first and second sub transistors of the second transistor group TG2 are electrically connected to each other and to the drain electrode of the first sub transistor, so that the output signal of the next stage Gn+1 applied to the drain electrode of the first sub transistor is also applied to the gate electrodes of the first and second sub transistors of the second transistor group TG2.

The charging control section 170 drops the output signal of the next stage Gn+1 by an amount of a sum of threshold voltages Vth of the sub transistors of the second transistor group TG2 to apply a dropped output signal of the next stage Gn+1 to the second node N2. For example, when the second transistor group TG2 includes n numbers of the sub transistors, an amount of voltage drop becomes n×Vth.

The discharging control section 160 and the charging control section 170 electrically discharge a corresponding gate line GLn and maintain the gate line GLn to be at an off-level.

When the scan start signal STV or an output signal of a previous stage Gn−1 is at a high level, the output capacitor Cb is electrically charged, and when the second node N2 is at a high level, the output capacitor Cb is electrically discharged to perform an S-R latch operation.

When the output capacitor Cb is electrically charged via the scan start signal STV or the output signal of a previous stage Gn−1 is at a high level, a first clock signal CKV or a second clock signal CKVB applied to the clock terminal CK is applied to a gate line of a display panel through the second transistor TR2 that is turned on such as by a voltage of the node N1, and when the third transistor TR3 is turned on by a voltage of the second node N2, a voltage of the gate line is pulled down to be first source voltage VOFF.

When the scan start signal STV or the output signal Gn−1 of a previous stage is applied to the first transistor TR1, the first transistor group TG1 is turned on, and therefore the first source voltage Voff passes through the source electrode of the last sub transistor (e.g., the second sub transistor, as illustrated) within the first transistor group TG1 and the drain electrode of the first sub transistor within the first transistor group TG1 to pull down a voltage of the second node N2 to be the first source voltage VOFF, so that the third and fourth transistors TR3 and TR4 are turned off via the gate electrodes of the third and fourth transistors TR3 and TR4 that are electrically connected to the second node N2. Therefore, the first node N1 is in a high level that corresponds to the output signal of the previous stage Gn−1.

When the second node N2 is in a low level, the fourth transistor TR4 is turned off to maintain the first node N1 in a low level. Therefore, the clock signal from the clock terminal CK is applied to the gate line. Also when the second node N2 is in a low level, the third transistor TR3 is turned off, so that the gate line transfers the clock signal CK rather than the first source voltage Voff.

The output signal of the present stage Gn applied to the gate line is used for a start signal of a next stage Gn+1, so that the second transistor group TG2 is turned on to pull up the second node N2. Therefore, the frame capacitor Ccharge is electrically charged. The second transistor group TG2 operates as a diode, so that even when the gate signal Gn+1 becomes low, the second node N2 maintains in high level.

When the second node N2 is in a high level, the third and fourth transistors TR3 and TR4 are turned on, so that the first node N1 and the output signal Gn are lowered as the third and fourth transistors TR3 and TR4 apply the first source voltage Voff to the gate line Gn and the first node N1. The second node N2 maintains a high level until a gate signal Gn−1 of the previous stage is applied to the gate electrode of the first transistor TR1.

When the gate signal Gn+1 is high, a voltage of Von−(n× Vth) is applied to the second node N2, wherein Vth represents a threshold voltage of the sub transistors within the second transistor group TG2, and 'n' represents a number of the sub transistors of the second transistor group TG2. For example, when the second transistor group TG2 includes two sub transistors, 'n' equals two, when the second transistor group TG2 includes three sub transistors, 'n' equals three, etc.

Referring to FIGS. 2A through 2I, when the gate signal Gn+1 becomes low, the first sub transistor in the first and second transistor groups TG1 and TG2 operates under a condition that a voltage Vgs between the gate and source electrodes of the first sub transistor in the first and second transistor groups TG1 and TG2 is substantially 0V, and remaining sub transistors (or the second sub transistor) in the first and second transistor groups TG1 and TG2 operate under a condition that a voltage Vgs between the gate and source electrodes of the remaining sub transistors (or the second sub transistor, as illustrated) in the first and second transistor groups TG1 and TG2 is substantially −Vth.

For example, when the second transistor group TG2 includes three sub transistors, the first sub transistor operates under a condition that the voltage Vgs between the gate and source electrodes of the first sub transistor is 0V, and the second and third sub transistors operate under a condition that Vgs between the gate and source electrodes of the second and third sub transistors is −Vth.

When the first and second transistor groups TG1 and TG2 include sub transistors that operate under a condition of negative Vgs, an electrical charge stored at the second node N2 is minimized to lower a leakage current that flows through the first and second transistor groups TG1 and TG2, so that a voltage of the second node N2 becomes stable.

Figure 2A:
FIGS. 2A to 2I are timing charts illustrating signals in FIG. 1.
Figure 2B:
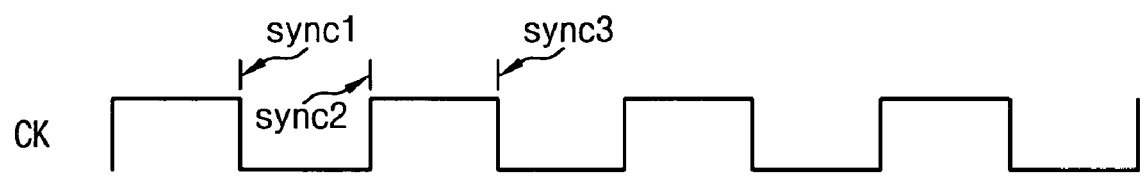
Figure 2C:
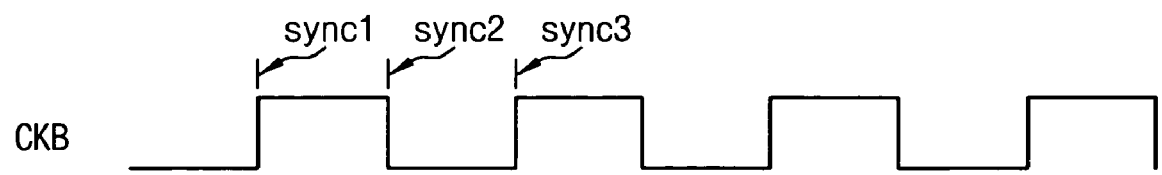
Figure 2D:
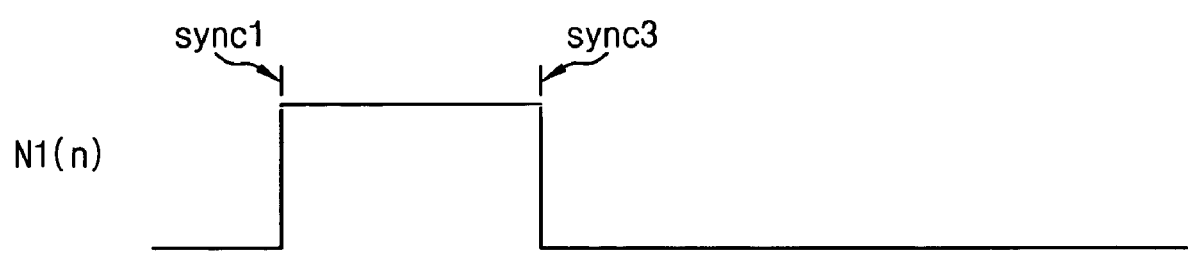
Figure 2E:
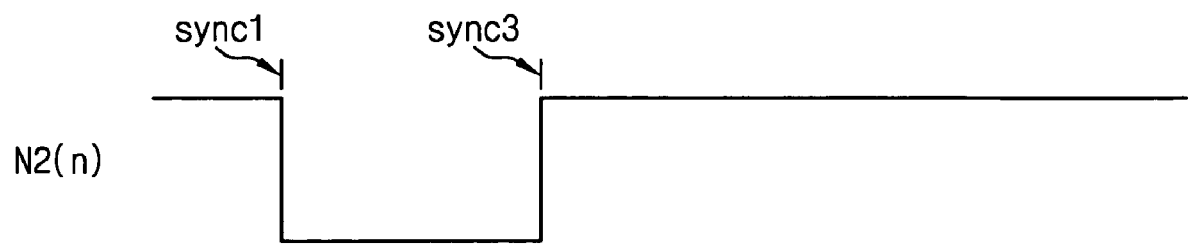
Figure 2F:
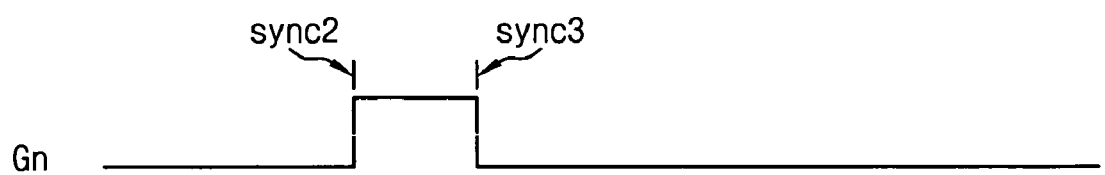
Figure 2G:
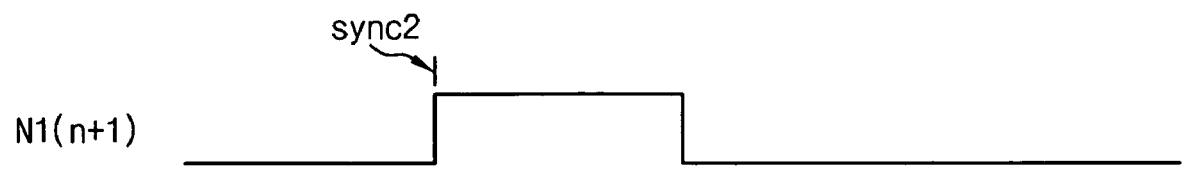
Figure 2H:
Figure 2I:
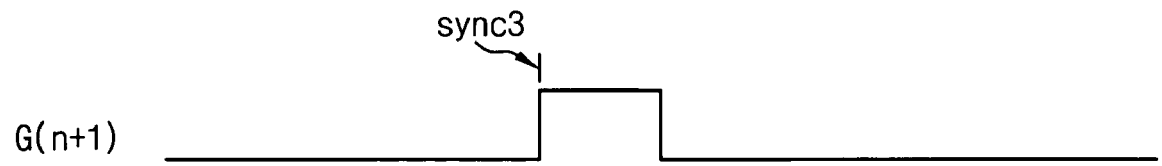

Thus, as shown in FIGS. 2A, 2F, and 2I, the gate signals for gate lines Gn−1, Gn, and Gn+1 are delivered sequentially, as illustrated by gate signal Gn−1 applied at sync1 and ending at sync2, gate signal Gn applied at sync2 and ending at sync3, and gate signal Gn+1 applied at sync3 and ending within a same time period as the span of gate signals Gn−1 and Gn. As illustrated in FIGS. 2B and 2C, the first and second clock signals CK and CKB are shown to have opposite phase from each other, where each high level and low level of the respective phases are applied for the same time period as the application of the gate signals. As shown in FIGS. 2D and 2E, nodes N1 and N2 for the n-th stage are shown to have opposite high and low levels that extend for a time period extending for twice the time of a high level gate or clock signal. Similarly, FIGS. 2G and 2H illustrate nodes N1 and N2 for the (n+1)-th stage that extend for a time period extending for twice the time of a high level gate or clock signal, and also start their high or low levels midway during the high or low levels of the nodes N1 and N2 for the n-th stage.

Figure 3A:
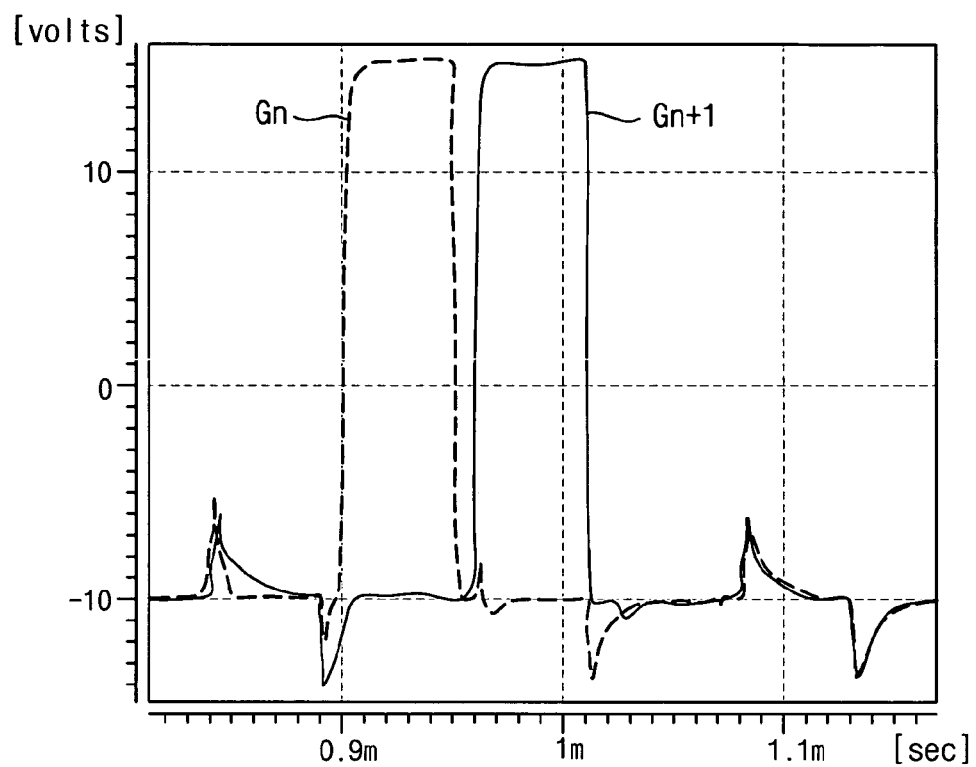
FIGS. 3A and 3B are graphs illustrating simulation results outputted from the shift region in FIG. 1.
Figure 3B:
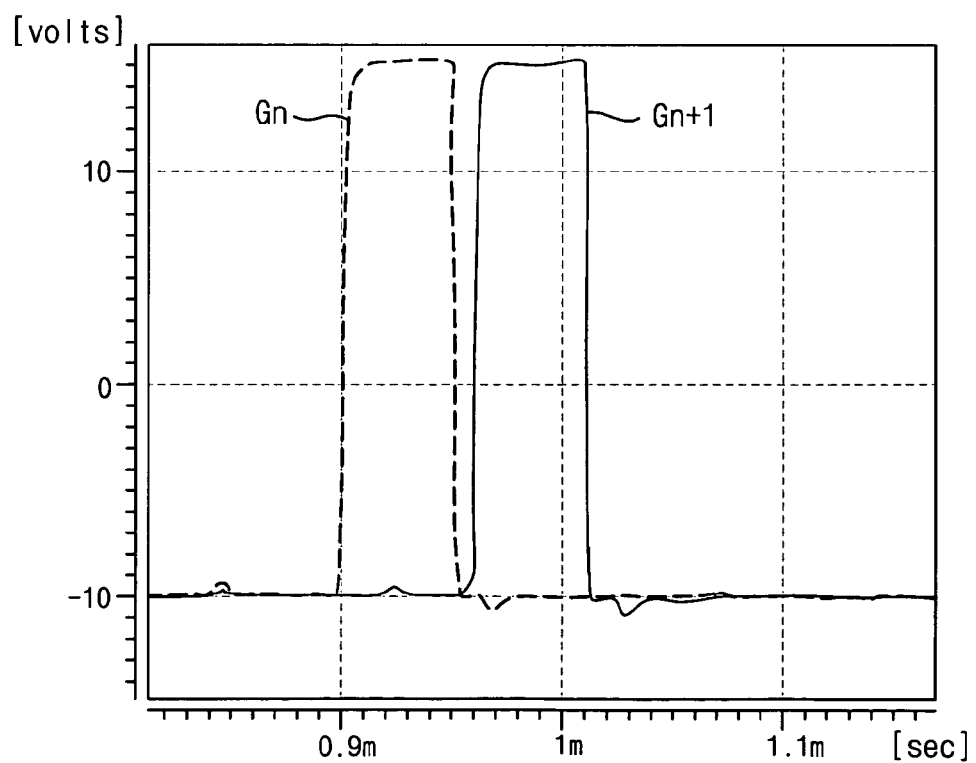

FIGS. 3A to 3B are graphs illustrating simulation results outputted from the shift region in FIG. 1. In particular, FIG. 3A illustrates the gate signal Gn of the present stage, and the gate signal Gn+1 of the next stage when a common voltage Vcom, applied to a unit pixel within a display device incorporating the unit stage, corresponds to the clock signal, and FIG. 3B illustrates the gate signal Gn of the present stage, and the gate signal Gn+1 of the next stage when a common voltage Vcom, applied to the unit pixel, corresponds to DC voltage.

Referring to FIG. 3A, when the clock signal is used for the common voltage Vcom, impulses are generated before and after gate signals.

Referring to FIG. 3B, when the DC voltage is used for the common voltage Vcom, impulses are reduced.

Therefore, adopting the DC voltage as the common voltage Vcom is preferable.

When each of the first and second transistor groups TG1 and G2 employs two sub transistors and a DC voltage applied to the second node N2 is lowered, a gradual failure of the third and fourth transistors TR3 and TR4 is prevented.

Figure 4:
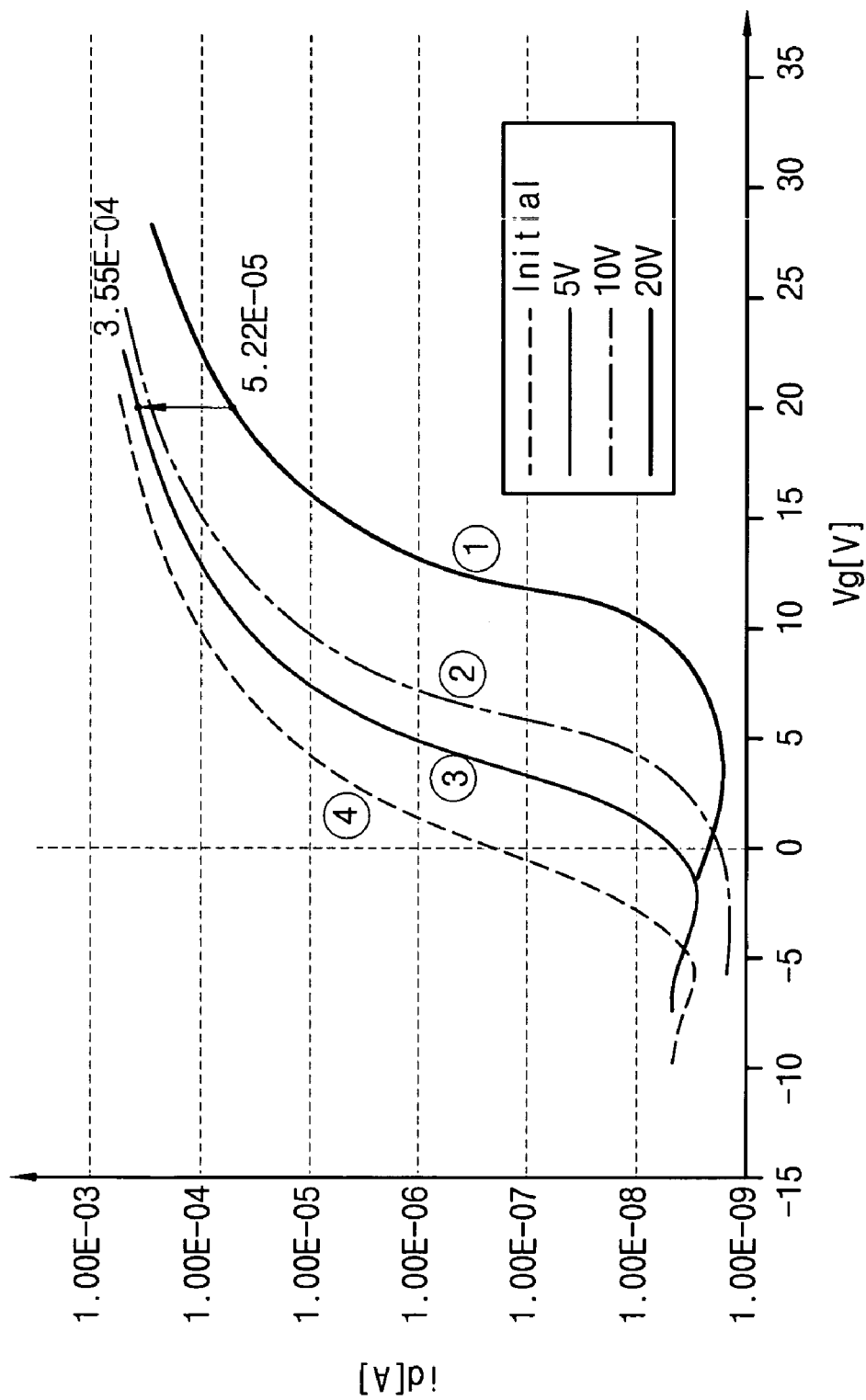
FIG. 4 shows graphs illustrating a relation between a gate voltage and a drain current of a transistor suffering from a gradual failure.

FIG. 4 shows graphs illustrating a relation between a gate voltage Vg and a drain current id of a transistor suffering from a gradual failure. In FIG. 4, a first graph "1" is obtained from a TFT including a gate electrode that is gradually suffering from about 20V applied thereto for a long time (for example, about 1 hour), a second graph "2" is obtained from a TFT including a gate electrode that is gradually suffering from about 10V applied thereto for a long time (for example, about 1 hour), and a third graph "3" is obtained from a TFT including a gate electrode that is gradually suffering from about 5V applied thereto for a long time (for example, about 1 hour). A fourth graph "4" is obtained from a TFT including a gate electrode that is suffering from no DC voltage applied thereto.

Referring to FIG. 4, a drain current id of about $3.55 \times 10^{-4}$ A flows when about 5V DC voltage is applied to a gate electrode as shown in the third graph "3". On the other hand, a drain current id of about $5.22 \times 10^{-5}$ A flows when about 20V DC voltage is applied to a gate electrode as is shown in the first graph "1". Therefore, the drain current id corresponding to 5V DC voltage is about 6.8 times greater than the drain current id corresponding to 20V.

The result shows that when each of the discharging control section 160 and the charging control section 170 includes a plurality of sub transistors electrically connected in series with each other, a gradual failure of the third and fourth transistors TR3 and TR4 is reduced.

Figure 5:
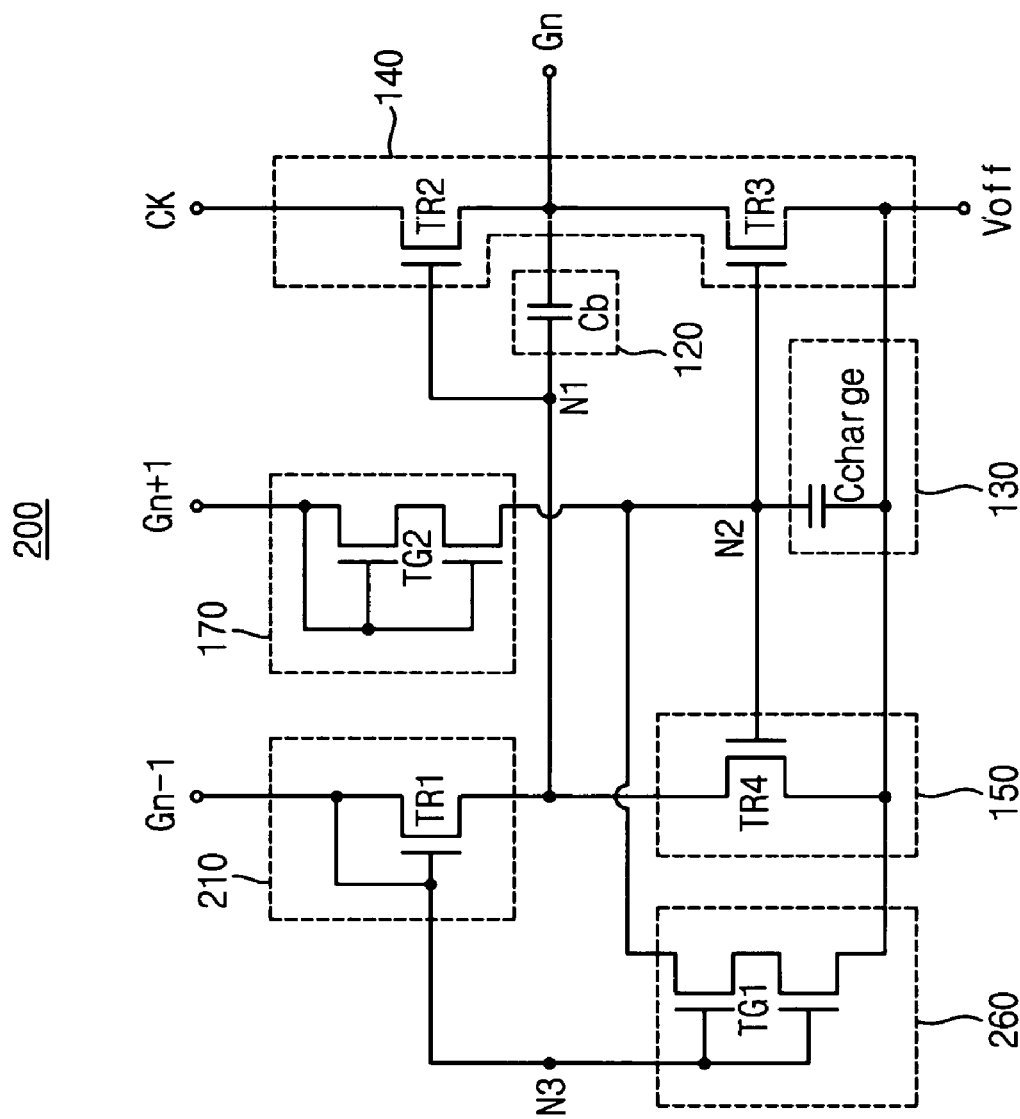
FIG. 5 is a circuit diagram illustrating another exemplary embodiment of a shift register according to the present invention.

FIG. 5 is a circuit diagram illustrating another exemplary embodiment of a shift register according to the present invention.

Referring to FIG. 5, a unit stage 200 of a shift register includes a buffering section 210, an output charging section 120, a source charging section 130, a driving section 140, a discharging section 150, a discharging control section 260, and a charging control section 170. The unit stage 200 outputs a gate signal (or scan signal) based on a scan start signal STV or an output signal Gn−1 of a previous stage. The unit stage 200 of this embodiment is substantially the same as the exemplary embodiment illustrated in FIG. 1 except for the buffering section 210 and the discharging control section 260. Thus, the same reference numerals will be used to refer to the same or like parts as those described in the exemplary embodiment illustrated in FIG. 1 and any further explanation concerning the above elements will be omitted.

The buffering section 210 includes a first transistor TR1 that includes a gate electrode electrically connected to a third node N3, a drain electrode electrically connected to the gate electrode, and a source electrode electrically connected to the first node N1. A scan start signal or a previous gate signal (an output signal of a previous stage) Gn−1 is applied to the gate and drain electrodes of the first transistor TR1.

The discharging control section 260 includes a first transistor group TG1 having a plurality of sub transistors connected in series. While more than two sub transistors may be provided within the first transistor group TG2, as illustrated, the first transistor group TG1 includes, for example, a first sub transistor and a second sub transistor. A drain electrode of the first sub transistor of the first transistor group TG1 is electrically connected to the second node N2. A source electrode of the first sub transistor of the first transistor group TG1 is electrically connected to a drain electrode of the second sub transistor. A source electrode of the second sub transistor is electrically connected to first source voltage Voff. Gate electrodes of the first and second sub transistors are connected to the third node N3, and may also be electrically connected to each other as shown. Thus, this embodiment differs from the prior embodiment in that the gate electrodes of the first and second sub transistors are connected to the third node N3 instead of to the first node N1 as in the unit stage 100.

Figure 6:
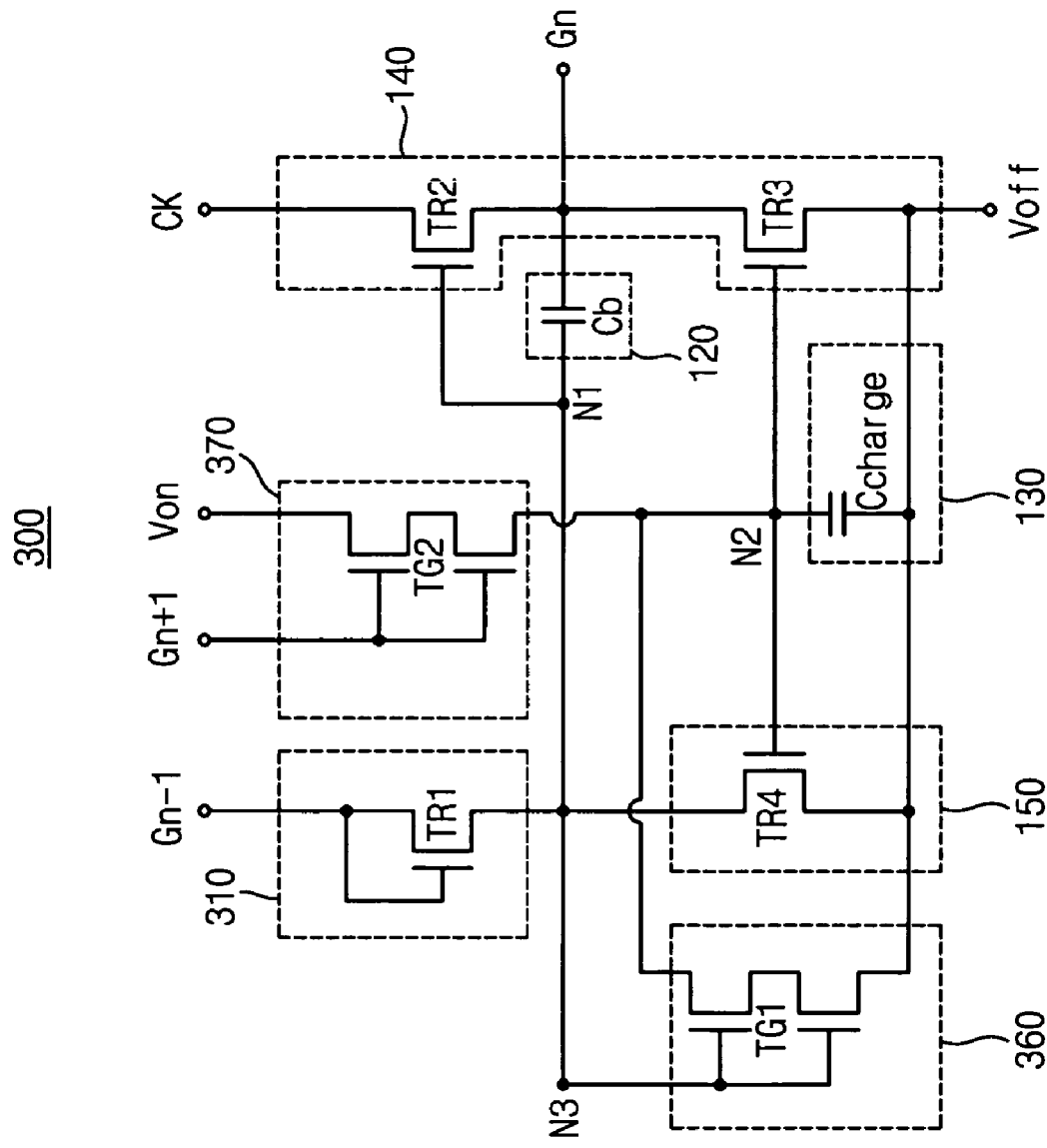
FIG. 6 is a circuit diagram illustrating still another exemplary embodiment of a shift register according to the present invention.

FIG. 6 is a circuit diagram illustrating still another exemplary embodiment of a shift register according to the present invention.

Referring to FIG. 6, a unit stage 300 of a shift register includes a buffering section 310, an output charging section 120, a source charging section 130, a driving section 140, a discharging section 150, a discharging control section 360, and a charging control section 370. The unit stage 300 outputs a gate signal (or scan signal) based on a scan start signal STV or an output signal Gn−1 of a previous stage. The unit stage 300 of this embodiment is substantially the same as the exemplary embodiment illustrated in FIG. 5 except for the buffering section 310, the discharging control section 360, and the charging control section 370. Thus, the same reference numerals will be used to refer to the same or like parts as those described in the unit stage 200 described with respect to FIG. 5 and any further explanation concerning the above elements will be omitted.

The buffering section 310 includes a first transistor TR1. The first transistor TR1 includes a drain electrode, a gate electrode electrically connected to the drain electrode, and a source electrode electrically connected to a first node N1, similar to the buffering section 110 of the unit stage 100. The output signal Gn−1 of a previous stage is applied to the drain and gate electrodes of the first transistor TR1.

The discharging control section 360 includes a first transistor group TG1. The first transistor group TG1 includes a plurality of transistor connected in series. While more than two sub transistors may be employed within the first transistor group TG1, as illustrated, the first transistor group TG1 includes, for example, a first sub transistor and a second sub transistor. A drain electrode of a first sub transistor of the first transistor group TG1 is electrically connected to the second node N2. A source electrode of the first sub transistor is electrically connected to a drain electrode of the second sub transistor within the first transistor group TG1. A source electrode of the second sub transistor is electrically connected to the first source voltage VOFF. Gate electrodes of the first and second sub transistors of the first transistor group TG1 are electrically connected to the third node N3, and they may also be electrically connected to each other as shown.

The charging control section 370 includes a second transistor group TG2. The second transistor group TG2 includes a plurality of transistors connected in series. While the second transistor group TG2 may include more than two sub transistors, as illustrated, the second transistor group TG2 includes, for example, a first sub transistor and a second sub transistor. A drain electrode of a first sub transistor is electrically connected to a second source voltage Von. A source electrode of the first sub transistor is electrically connected to a drain electrode of the second sub transistor. A source electrode of the second sub transistor is electrically connected to the second node N2. Gate electrodes of the first and second sub transistors of the second transistor group TG2 are electrically connected to each other, and the output signal of the next stage Gn+1 is applied to the gate electrodes of the first and second sub transistors. Thus, if the first and second sub transistors of the second transistor group TG2 are turned on via their respective gate electrodes receiving a high level of the output signal of the next stage Gn+1, then the second transistor group TG2 applies the second source voltage Von to the second node N2.

Figure 7:
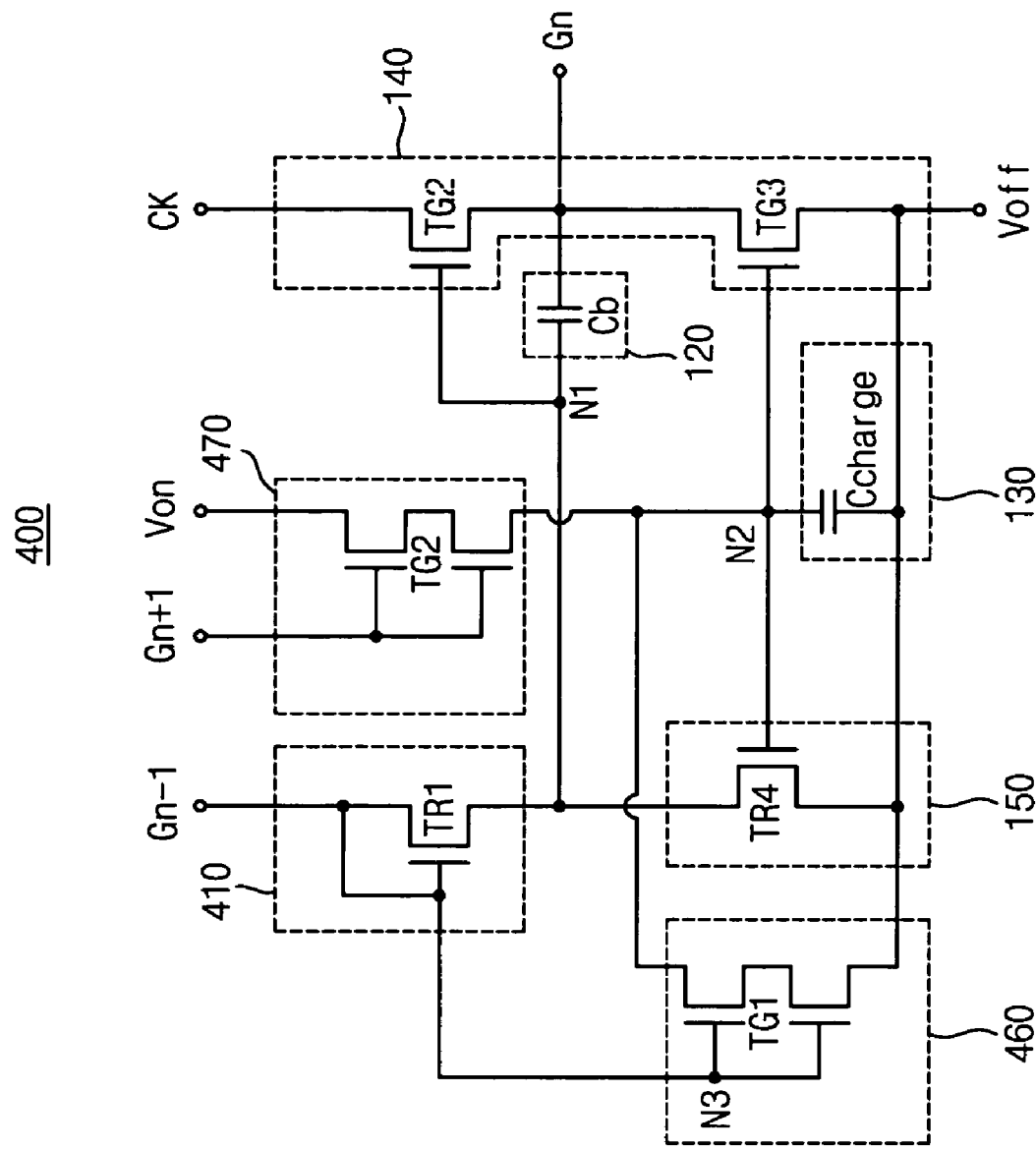
FIG. 7 is a circuit diagram illustrating still another exemplary embodiment of a shift register according to the present invention.

FIG. 7 is a circuit diagram illustrating still another exemplary embodiment of a shift register according to the present invention.

Referring to FIG. 7, a unit stage 400 of a shift register includes a buffering section 410, an output charging section 120, a source charging section 130, a driving section 140, a discharging section 150, a discharging control section 460, and a charging control section 470. The unit stage 400 outputs a gate signal (or scan signal) based on a scan start signal STV or an output signal Gn−1 of a previous stage. The unit stage 400 of this embodiment is substantially the same as the exemplary embodiment illustrated in FIG. 1 except for the buffering section 410, the discharging control section 460, and the charging control section 470. Thus, the same reference numerals will be used to refer to the same or like parts as those described in the exemplary embodiment illustrated in FIG. 1 and any further explanation concerning the above elements will be omitted.

The buffering section 410 includes a first transistor TR1 that includes a gate electrode electrically connected to a third node N3, a drain electrode electrically connected to the gate electrode, and a source electrode electrically connected to the first node N1. A scan start signal or a previous gate signal (an output signal of a previous stage) Gn−1 is applied to the gate and drain electrodes of the first transistor TR1.

The discharging control section 460 includes a first transistor group TG1 having a plurality of sub transistors connected in series. While the first transistor group TG1 may include more than two sub transistors, as illustrated, the first transistor group TG1 includes, for example, a first sub transistor and a second sub transistor. A drain electrode of the first sub transistor of the first transistor group TG1 is electrically connected to the second node N2. A source electrode of the first sub transistor of the first transistor group TG1 is electrically connected to a drain electrode of the second sub transistor. A source electrode of the second sub transistor is electrically connected to first source voltage Voff. Gate electrodes of the first and second sub transistors are connected to the third node N3, and may also be electrically connected to each other as shown.

The charging control section 470 includes a second transistor group TG2. The second transistor group TG2 includes a plurality of transistors connected in series. While the second transistor group TG2 may include more than two sub transistors, the second transistor group TG2 includes, for example, a first sub transistor and a second sub transistor. A drain electrode of a first sub transistor is electrically connected to a second source voltage Von. A source electrode of the first sub transistor is electrically connected to a drain electrode of the second sub transistor. A source electrode of the second sub transistor is electrically connected to the second node N2. Gate electrodes of the first and second sub transistors of the second transistor group TG2 are electrically connected to each other, and the output signal of the next stage Gn+1 is applied to the gate electrodes of the first and second sub transistors. Thus, if the first and second sub transistors of the second transistor group TG2 are turned on via their respective gate electrodes receiving a high level of the output signal of the next stage Gn+1, then the second transistor group TG2 applies the second source voltage Von to the second node N2.

Figure 8:
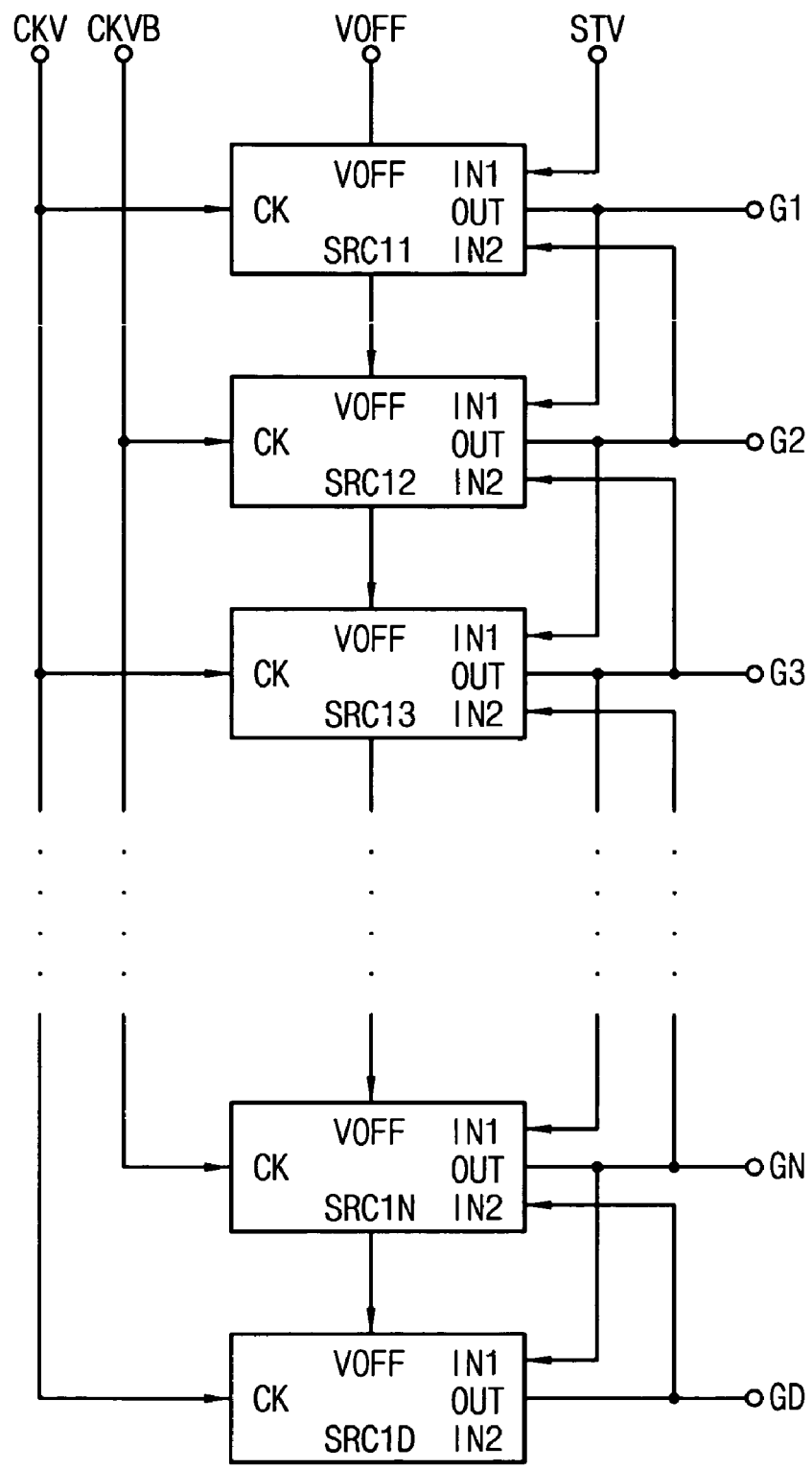
FIG. 8 is a block diagram illustrating an exemplary embodiment of a gate driving circuit according to the present invention.

FIG. 8 is a block diagram illustrating an exemplary embodiment of a gate driving circuit according to the present invention. The gate driving circuit may be applied to a liquid crystal display ("LCD") apparatus.

Referring to FIG. 8, a gate driving circuit includes a shift register. The shift register includes a plurality of stages SRC11, SRC12, . . . , SRC1N and SRC1D. The stages SRC11, SRC12, . . . , SRC1N correspond to gate lines G1, G2, . . . , GN. The stage SRC1D corresponds to a dummy stage. Each of the stages includes a first input terminal IN1, a second input terminal IN2, an output terminal OUT, a clock terminal CK, and a first voltage source input terminal VOFF. The output terminal OUT of m-th stage SRC1m is electrically connected to the first input terminal IN1 of (m+1)-th stage SRC1m+1, and to the second input terminal IN2 of (m−1)-th stage SRC1m−1.

A scan start signal STV is applied to the first input terminal IN1 of the first stage SRC11. The scan start signal STV is outputted from an external graphic controller synchronized with a vertical synchronization signal Vsync.

The stages SRC11, SRC12, . . . , SRC1N apply output signals to gate lines G1, G2, . . . , GN formed on an array substrate, respectively. A first clock signal CKV is applied to the clock terminals CK of odd numbered stages SRC11, SRC13, . . . SRC1N−1, as well as dummy terminal SRC1D. A second clock signal CKVB is applied to the clock terminals CK of even numbered stages SRC12, SRC14, . . . , SRC1N. The first and second clock signals CKV and CKVB have an opposite phase to each other, as illustrated in FIGS. 2B and 2C. A duty time of the first and second clocks CKV and CKVB may be about 16.6/N [ms].

An output signal of an m-th stage SRC1m, which corresponds to a control signal, is applied to the second input terminal IN2 of an (m−1)-th stage SRC1m−1.

Therefore, each of the stages SRC11, SRC12, . . . , SRC1N applies the output signal to the gate lines in sequence.

The last stage SRC1N requires a control signal applied to the second input terminal IN2 of the last stage SRC1N, therefore the shift register includes the dummy stage SRC1D in order to apply the control signal to the second input terminal IN2 of the last stage SRC1N.

As previously described, the first and second clock signals CKV and CKVB have opposite phase to each other. Alternatively, the first and second clock signals CKV and CKVB may have a phase difference such as 90 degrees, 270 degrees, etc. Furthermore, the stages of the shift register are divided into two sets of stages including odd numbered stages having the first clock signal CKV applied thereto, and even numbered stages having the second clock signal CKVB applied thereto. Alternatively, the stages may be divided into more than two sets.

As described above, according to the present invention, a node, which discharges the gate lines or maintains the gate lines to be in a stable voltage, is electrically connected to another node in the circuit, so that the node maintains a relatively low voltage.

When a high voltage is applied to a transistor, a threshold voltage Vth is changed to be in a range from about 1V to about 15V, so that the transistor suffers a gradual failure. Therefore, when the relatively low voltage is applied to the node that is electrically connected to the transistor, the gradual failure of the transistor is prevented.

Figure 9:
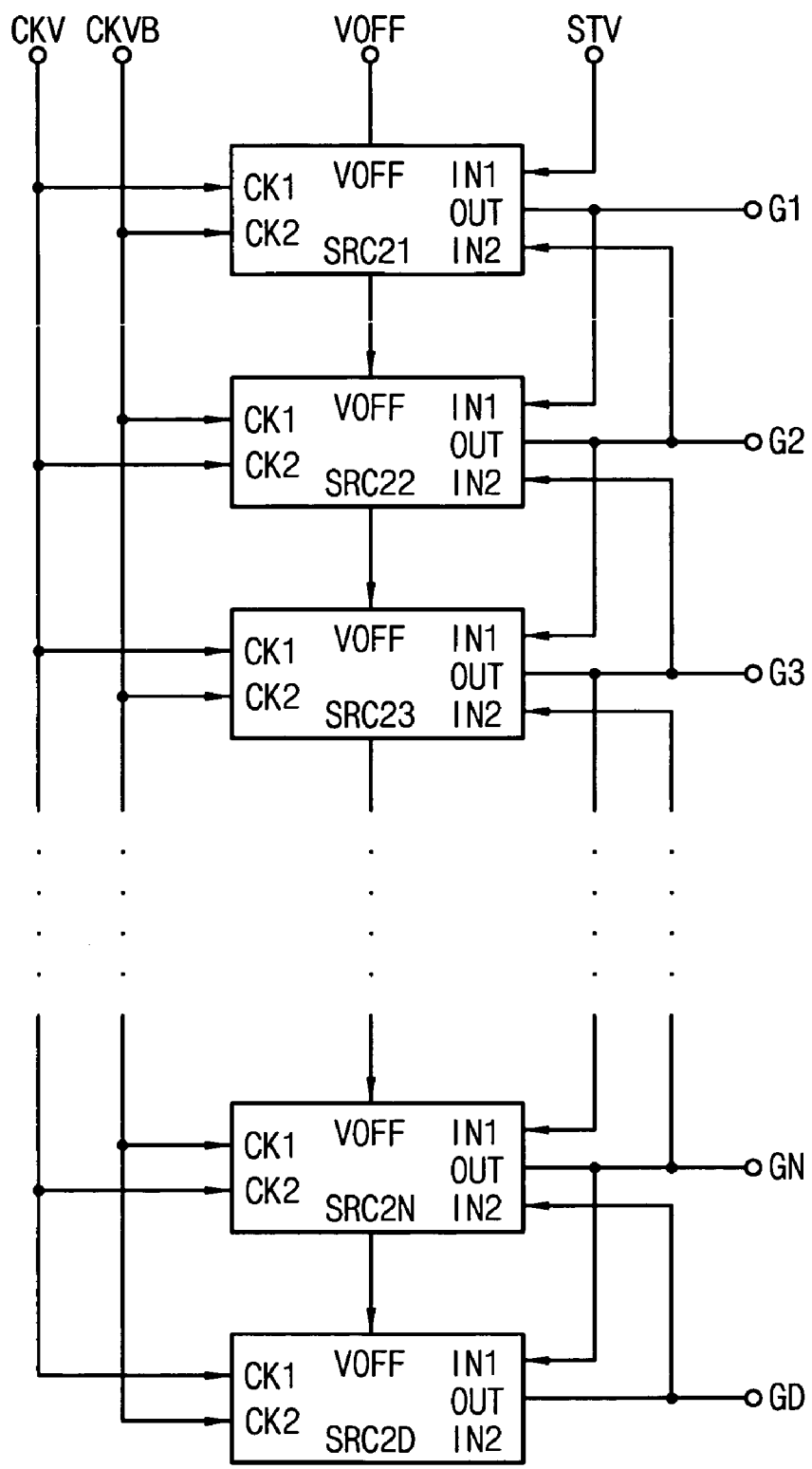
FIG. 9 is a block diagram illustrating another exemplary embodiment of a gate driving circuit according to the present invention.

FIG. 9 is a block diagram illustrating another exemplary embodiment of a gate driving circuit according to the present invention. The gate driving circuit may be applied to an LCD apparatus.

Referring to FIG. 9, a gate driving circuit includes a shift register. The shift register includes a plurality of stages SRC21, SRC22, . . . , SRC2N, SRC2D. The stages SRC21, SRC22, . . . , SRC2N correspond to gate lines G1, G2, . . . , GN. The stage SRC2D corresponds to a dummy stage. Each of the stages SRC21, SRC22, . . . , SRC2N, SRC2D includes a first input terminal IN1, a second input terminal IN2, an output terminal OUT, a first clock terminal CK1, a second clock terminal CK2, and a first voltage source input terminal VOFF. The output terminal OUT of m-th stage SRC2m is electrically connected to the first input terminal IN1 of (m+1)-th stage SRC2m+1, and to the second input terminal IN2 of (m−1)-th stage SRC2m−1.

A scan start signal STV is applied to the first input terminal IN1 of the first stage SRC21. The scan start signal STV is outputted from an external graphic controller synchronized with a vertical synchronization signal Vsync.

The stages SRC21, SRC22, . . . , SRC2N apply output signals to gate lines G1, G2, . . . , GN formed on an array substrate, respectively. A first clock signal CKV and a second clock signal CKVB are applied to the first and second clock terminals CK1 and CK2 of odd numbered stages SRC21, SRC23, . . . , SRC2N−1, SRC2D, respectively. The first clock signal CKV and the second clock signal CKVB are applied to the second and first clock terminals CK2 and CK1 of even numbered stages SRC22, SRC24, . . . , SRC2N, respectively. The first and second clock signals CKV and CKVB have an opposite phase to each other, as illustrated in FIGS. 2B and 2C. A duty time of the first and second clocks CKV and CKVB may be about 16.6/N [ms].

An output signal of an m-th stage SRC2$m$, which corresponds to a control signal, is applied to the second input terminal IN2 of an (m−1)-th stage SRC2$m$−1.

Therefore, each of the stages SRC21, SRC22, . . . , SRC2N applies output signals to the gate lines in sequence.

The last stage SRC2N requires a control signal applied to the second input terminal IN2 of the last stage SRC2N, therefore the shift register includes an additional dummy stage SRC2D in order to apply the control signal to the second input terminal IN2 of the last stage SRC2N.

As previously described, the first and second clock signals CKV and CKVB have opposite phase to each other. Alternatively, the first and second cluck signals CKV and CKVB may have a phase difference, for example, 90 degrees, 270 degrees, etc.

Figure 10:
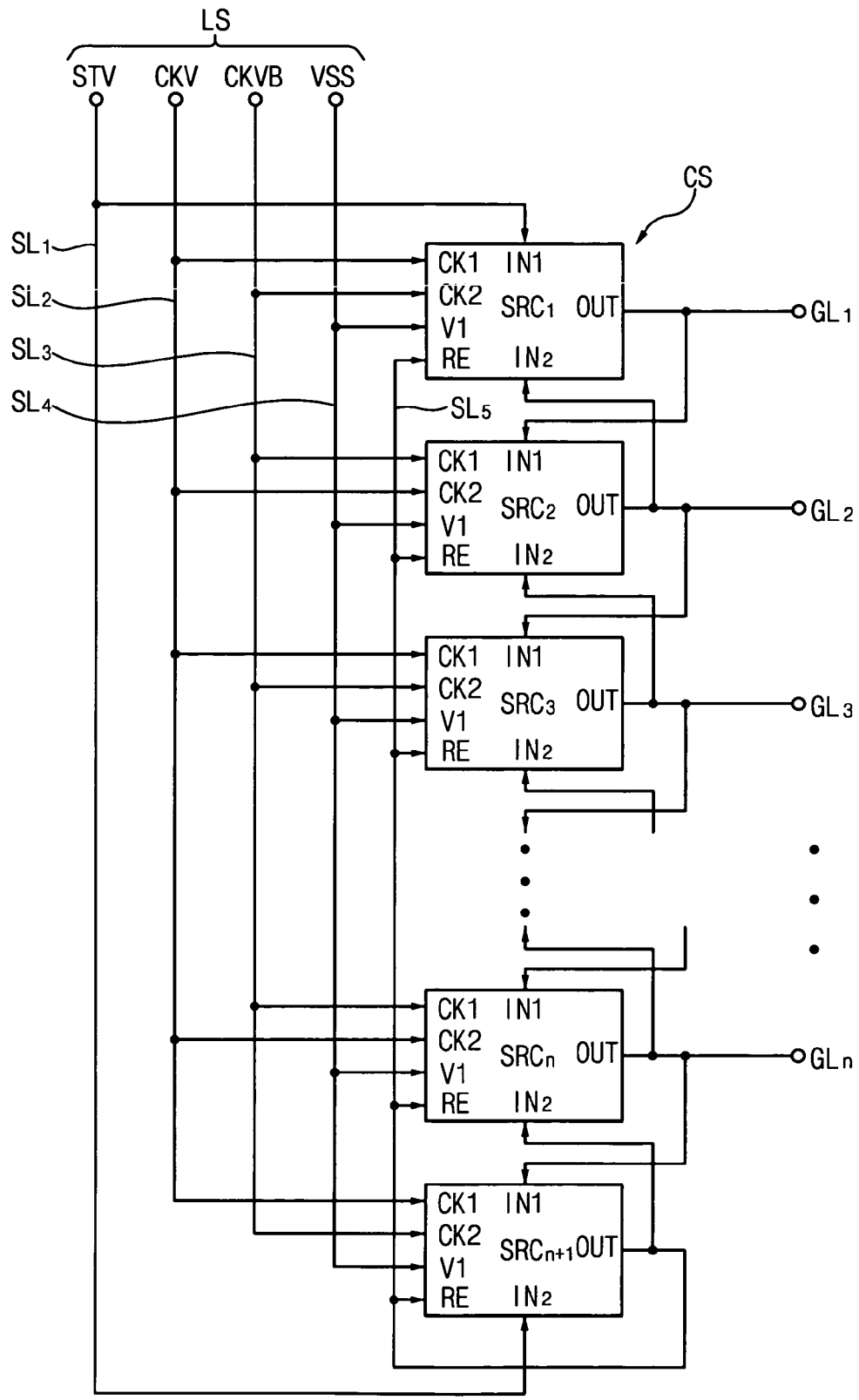
FIG. 10 is a block diagram illustrating still another exemplary embodiment of a gate driving circuit according to the present invention.

FIG. 10 is a block diagram illustrating still another exemplary embodiment of a gate driving circuit according to the present invention. The gate driving circuit may be applied to an LCD apparatus.

Referring to FIG. 10, a gate driving circuit includes a shift register. The shift register includes a circuit section CS and a line section LS. The circuit section CS includes a plurality of stages SRC1, SRC2, . . . , SRCn, SRCn+1, wherein 'n' is an even number. The stages SRC1, SRC2, . . . , SRCn correspond to gate lines GL1, GL2, . . . , GLn. The stage SRCn+1 corresponds to a dummy stage. The line section LS includes a plurality of lines that may extend substantially perpendicular to the gate lines GL1, GL2, . . . , GLn.

Each of the stages SRC1, SRC2, . . . , SRCn, SRCn+1 includes a first input terminal IN1, a second input terminal IN2, an output terminal OUT, a first clock terminal CK1, a second clock terminal CK2, a ground voltage terminal V1, and a reset terminal RE.

A first clock signal CKV and a second clock signal CKVB are applied to the first and second clock terminals CK1 and CK2 of odd numbered stages SRC1, SRC3, . . . , SRCn+1, respectively. A first clock signal CKV and a second clock signal CKVB are applied to the second and first clock terminals CK2 and CK1 of even numbered stages SRC2, SRC4, . . . , SRCn, respectively. The first and second clock signals CKV and CKVB have a different phase with each other, such as illustrated in FIGS. 2B and 2C, for example.

A scan start signal STV is applied to the first input terminal IN1 of the first stage SRC1. The scan start signal STV is outputted from an external graphic controller synchronized with a vertical synchronization signal Vsync.

The output terminal OUT of m-th stage SRCm is electrically connected to the first input terminal IN1 of (m+1)-th stage SRCm+1, and to the second input terminal IN2 of (m−1)-th stage SRCm−1.

The last stage SRCn requires a control signal applied to the second input terminal IN2 of the last stage SRCn, therefore the shift register includes an additional dummy stage SRCn+1 in order to apply the control signal to the second input terminal IN2 of the last stage SRCn. Additionally, a ground voltage VSS is applied to the ground voltage terminals V1 of the stages SRC1, SRC2, . . . , SRCn, SRCn+1, and the output signal of the dummy stage SRCn+1 is applied to the reset terminal RE of the stages SRC1, SRC2, . . . , SRCn.

The first clock signal CKV is outputted through output terminals OUT of the odd numbered stages SRC1, SRC3, . . . , SRCn+1, and the second clock signal CKVB is outputted through output terminals OUT of the even numbered stages SRC2, SRC4, . . . , SRCn.

The stages SRC1, SRC2, . . . , SRCn apply output signals to gate lines G1, G2, . . . , Gn formed on an array substrate, respectively, in sequence.

The line section LS is adjacent to the circuit section CS. The line section LS includes a start signal line SL1, a first clock line SL2, a second clock line SL3, a ground voltage line SL4, and a reset line SL5. The start signal line SL1, the first clock line SL2, the second clock line SL3, the ground voltage line SL4, and the reset line SL5 are substantially in parallel with each other.

The reset line SL5 is positioned closet to the circuit section CS. The ground voltage line SL4 is positioned adjacent to the reset line SL5, and positioned between the reset line SL5 and the second clock line SL3. The second clock line SL3 is positioned adjacent to the ground voltage line SL4, and first clock line SL2 is positioned adjacent to the second clock line SL3, and positioned between the second clock line SL3 and the start signal line SL1. The start signal line SL1 is positioned adjacent to the first clock line SL2.

The scan start signal STV is applied to the first input terminal IN1 of the first stage SRC1 and the second input terminal IN2 of the last stage SRCn+1 through the start signal line SL1.

The first clock signal CKV is applied to the first clock terminals CK1 of the odd numbered stages SRC1, SRC3, . . . , SRCn+1, and the second clock terminals CK2 of the even numbered stages SRC2, SRC4, . . . , SRCn through the first clock line SL2.

The second clock signal CKVB is applied to the second clock terminals CK2 of the odd numbered stages SRC1, SRC3, . . . , SRCn+1, and the first clock terminals CK1 of the even numbered stages SRC2, SRC4, . . . , SRCn through the second clock line SL3.

The ground voltage VSS is applied to the ground voltage terminals V1 of the stages SRC1, SRC2, . . . , SRCn, SRCn+1 through the ground voltage line SL4.

A reset signal outputted from the last stage SRCn+1 is applied to the reset terminals RE of the stages SRC1, SRC2, . . . , SRCn, SRCn+1 through the reset line SL5.

Hereinafter, a liquid crystal display ("LCD") panel including a gate driving circuit (or shift register) having the a-Si TFT will be described.

Figure 11:
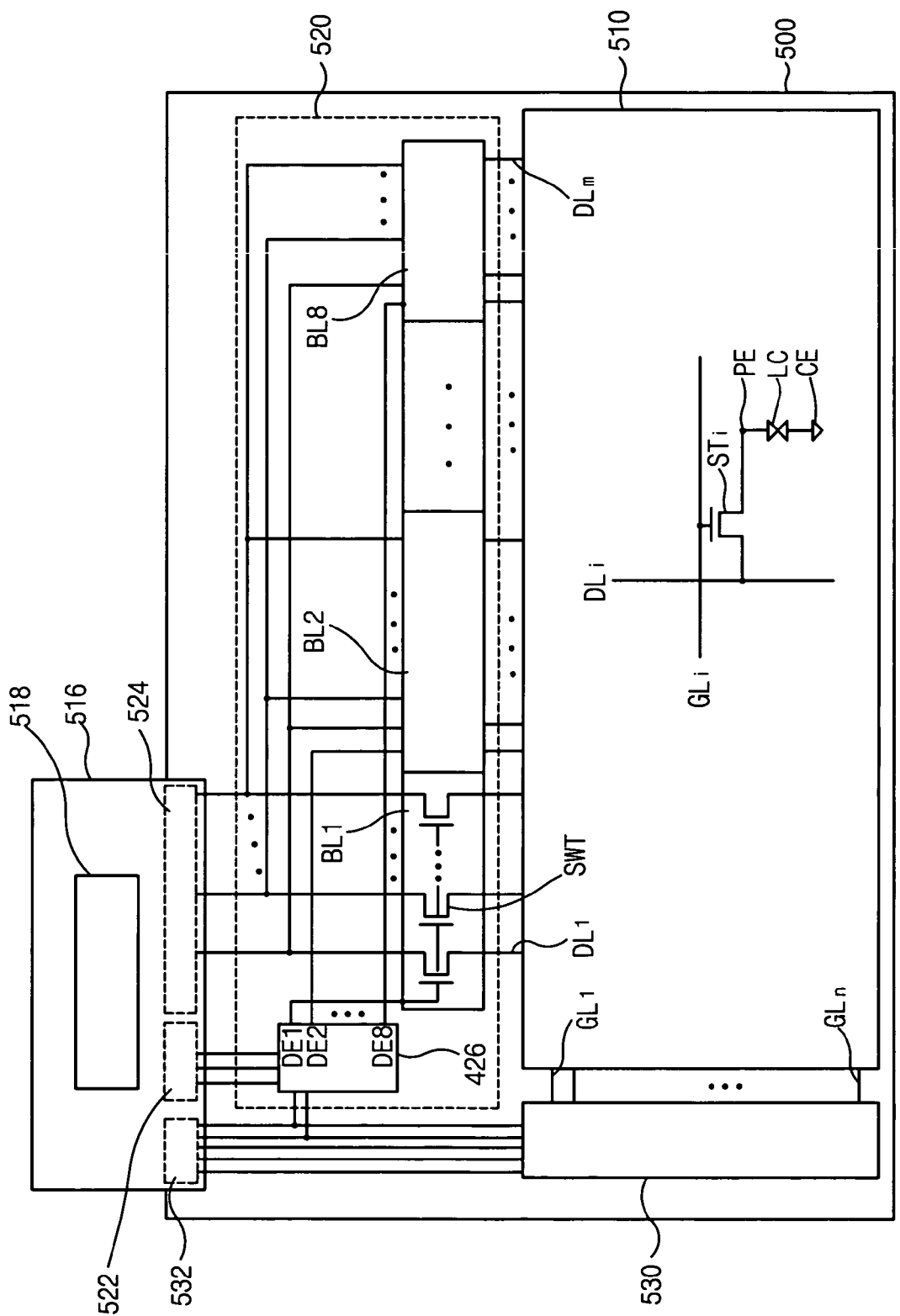
FIG. 11 is a block diagram illustrating an exemplary embodiment of a liquid crystal panel according to the present invention.

FIG. 11 is a block diagram illustrating an exemplary embodiment of an LCD panel according to the present invention. In particular, FIG. 11 illustrates an array substrate of a-Si TFT LCD panel.

Referring to FIG. 11, an array substrate 500 includes a cell array circuit 510, a data driving circuit 520, a first data terminal group 522, a second data terminal group 524, a gate driving circuit 530, and a gate terminal 532. The data driving circuit 520, the first data terminal group 522, the second data terminal group 524, the gate driving circuit 530, and the gate terminal 532 may be formed through a process of manufacturing TFTs of the cell array circuit 510. The gate driving circuit 530 corresponds to any one of the exemplary shift registers illustrated in FIGS. 8, 9, and 10. The shift registers may employ any one of the exemplary unit stages illustrated in FIGS. 1, 5, 6, and 7.

A data driving chip 518 is formed on a flexible printed circuit ("FPC") 516. The data driving chip 518 is electrically connected to the circuits of the array substrate 500 through the FPC 516. The FPC 516 applies a data driving signal, a data timing signal, a gate timing signal, and a gate signal to the data driving circuit 520 and the gate driving circuit 530 of the array substrate 500.

The cell array circuit 510 includes m numbers of data lines DL1, DL2, . . . , DLm and n numbers of gate lines GL1, GL2, . . . , GLn. Each of the data lines DL1, DL2, . . . , DLm and each of the gate lines GL1, GL2, . . . , GLn are substantially perpendicular to each other.

The cell array circuit 510 includes a plurality of TFTs arranged in a matrix shape. Each of the TFTs includes a gate electrode that is electrically connected to one of the gate lines GL1, GL2, . . . , GLn, a source electrode that is electrically connected to one of the data lines DL1, DL2, . . . , DLm, and a drain electrode that is electrically connected to a pixel electrode PE. A layer of liquid crystal ("LC") is disposed between the pixel electrode PE and a common electrode CE of a color filter substrate.

When data voltage is applied to the pixel electrode PE, electric fields are generated between the pixel electrode PE and the common electrode CE to alter an arrangement of liquid crystal molecules within the LC layer. As a result, optical transmittance is changed to display an image.

The data driving circuit 520 includes a shift register 426, and n numbers of switching transistors SWT. The n numbers of switching transistors SWT are grouped into eight data line blocks BL1, BL2, . . . , BL8. Therefore, each of the data line blocks BL1, BL2, . . . , BL8 includes n/8 number of switching transistors SWT.

Also, each of the data line blocks BL1, BL2, . . . , BL8 includes n/8 number of data input terminals electrically connected to the second data terminal group 524 including n/8 number of terminals, respectively, and n/8 number of output terminals that are each electrically connected to a data line group including n/8 number of data lines, respectively.

Each of the switching transistors SWT includes a plurality of a-Si TFT having a source electrode that is electrically connected to one of the data lines DL1, DL2, . . . , DLm, a drain electrode that is electrically connected to one of the data input terminals, and a gate electrode that is electrically connected to one of the gate block selection terminals.

Therefore, n numbers of data lines DL1, DL2, . . . , DLm are divided into eight blocks, and the shift register 426 selects the blocks in sequence.

The shift register 426 receives the first clock signal CKV, the second clock signal CKVB, and the scan start signal STV through the first data terminal group 522. Output terminals of the shift register 426 are electrically connected to the gate block selection terminals.

Thus, as described, for exemplary purposes only, the LCD panel employs the gate driving circuit. Alternatively, the gate driving circuit may be employed by other display panels such as, but not limited to, organic light emitting diode ("OLED") displays.

According to the present invention, the node of a stage, which electrically discharges a gate node or stably maintains the gate node to be gate off voltage level, is electrically connected to a node in the stage, so that a relatively low voltage is maintained to prevent gradual failure of TFT.

Having described the exemplary embodiments of the present invention and its advantages, it is noted that various changes, substitutions and alterations can be made herein without departing from the spirit and scope of the invention as defined by appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A shift register comprising a plurality of stages, each of the stages generating an output signal in sequence, each of the stages comprising:
    a buffering section receiving one of a scan start signal and an output signal of a previous stage;
    a driving section generating the output signal of a present stage, when the buffering section receives one of the scan start signal and the output signal of a previous stage;
    a first charging section including a first terminal electrically connected to the driving section and a second terminal electrically connected to a first source voltage; and
    a charging control section applying the output signal of a next stage to the first charging section.

2. The shift register of claim 1, wherein the first charging section includes a frame capacitor having the first and second terminals.

3. The shift register of claim 1, wherein the first source voltage is an off voltage.

4. The shift register of claim 1, further comprising a second charging section, the second charging section charging the output signal of the previous stage when the output signal of the previous stage is applied to the buffering section.

5. The shift register of claim 4, wherein the second charging section includes an output capacitor.

6. The shift register of claim 5, wherein the output capacitor is a parasitic capacitor.

7. The shift register of claim 4, wherein the second charging section includes a first terminal electrically connected to the buffering section through a first node to be charged by one of the scan start signal and the output signal of the previous stage and a second terminal electrically connected to an output terminal of the present stage.

8. The shift register of claim 1, further comprising a discharging section discharging one of the scan start signal and the output signal of the previous stage.

9. The shift register of claim 8, further comprising a discharging control section controlling the discharging section based on one of the scan start signal, the output signal of the previous stage, and charges stored in a second charging section.

10. The shift register of claim 9, wherein the discharging control section is turned on when one of the scan start signal and the output signal of the previous stage is applied thereto, and when the discharging control section is turned on, the discharging control section lowers a voltage of the first charging section.

11. The shift register of claim 9, wherein the discharging control section includes a plurality of transistors connected in series.

12. The shift register of claim 11, wherein gate electrodes of the transistors of the discharging control section are connected to the second charging section, a drain electrode of a first transistor within the discharging control section is electrically connected to the first charging section, and a source electrode of a last transistor within the discharging control section is electrically connected to the first source voltage.

13. The shift register of claim 11, wherein the output signal of the previous stage is applied to gate electrodes of the transistors of the discharging control section, a drain electrode of a first transistor of the discharging control section is electrically connected to the first charging section, and a source electrode of a last transistor of the discharging control section is electrically connected to the first source voltage.

14. The shift register of claim 1, wherein, when the output signal of the next stage is applied to the charging control section, the charging control section is turned on and charges the first charging section to a high level.

15. The shift register of claim 14, wherein the charging control section maintains the high level until the output signal of the previous stage is applied to the buffering section.

16. The shift register of claim 14, wherein the charging control section comprises a plurality of transistors connected in series.

17. The shift register of claim 16, wherein gate electrodes of the transistors of the charging control section are connected to a drain electrode of a first transistor within the charging control section and receive the output signal of the next stage, and a source electrode of a last transistor within the charging control section is electrically connected to the first charging section.

18. The shift register of claim 16, wherein the output signal of the next stage received by the charging control section is applied to gate electrodes of the transistors of the charging control section, a drain electrode of a first transistor of the charging control section is electrically connected to a second source voltage, and a source electrode of a last transistor of the charging control section is electrically connected to the first charging section.

19. The shift register of claim 1, wherein each of the stages further comprises a second charging section electrically connected to the buffering section through a first node to be charged by one of the scan start signal and the output signal of the previous stage, the first charging section electrically connected to the driving section and the charging control section through a second node, and the charging control section maintaining the second node at a low level when the first node is at a high level.

20. The shift register of claim 1, wherein the first charging section is electrically connected to the driving section and the charging control section through a node, and the charging control section lowers a voltage of the node by a sum of threshold voltages of the transistors connected in series to use the voltage of the node for a bias signal.

21. The shift register of claim 1, wherein the driving section generates the output signal based on one of a first clock signal and a second clock signal, when one of the scan start signal and the output signal of the previous stage is applied to the buffering section.

22. The shift register of claim 21, wherein the plurality of stages includes even numbered stages and odd numbered stages, the even numbered stages generating the output signal based on the second clock signal, and the odd numbered stages generating the output signal based on the first clock signal.

23. A gate driving circuit comprising a plurality of stages, each of the stages applying an output signal to gate lines in sequence, each of the stage comprising:
    a buffering section receiving one of a scan start signal and an output signal of a previous stage;
    a driving section generating the output signal of a present stage, when the buffering section receives one of the scan start signal and the output signal of the previous stage;
    a first charging section including a first terminal electrically connected to the driving section and a second terminal electrically connected to a first source voltage; and
    a charging control section applying the output signal of a next stage to the first charging section.

24. The gate driving circuit of claim 23, further comprising:
    a second charging section, the second charging section charging the output signal of the previous stage when the output signal of the previous stage is applied to the buffering section;
    a discharging section discharging one of the scan start signal and the output signal of the previous stage; and
    a discharging control section controlling the discharging section based on one of the scan start signal, the output signal of the previous stage, and charges stored in the second charging section,
    wherein the discharging control section includes a plurality of transistors connected in series, gate electrodes of the transistors connected to the second charging section, a drain electrode of a first transistor within the discharging control section electrically connected to the first charging section, and a source electrode of a last transistor within the discharging control section electrically connected to the first source voltage.

25. The gate driving circuit of claim 23, further comprising:
    a second charging section, the second charging section charging the output signal of the previous stage when the output signal of the previous stage is applied to the buffering section;
    a discharging section discharging one of the scan start signal and the output signal of the previous stage; and
    a discharging control section controlling the discharging section based on one of the scan start signal, the output signal of the previous stage, and charges stored in the second charging section,
    wherein the discharging control section includes a plurality of transistors connected in series, the output signal of the previous stage applied to gate electrodes of the transistors, a drain electrode of a first transistor within the discharging control section electrically connected to the first charging section, and a source electrode of a last transistor within the discharging control section electrically connected to the first source voltage.

26. The gate driving circuit of claim 23, further comprising:
- a second charging section, the second charging section charging the output signal of the previous stage when the output signal of the previous stage is applied to the buffering section;
- a discharging section discharging one of the scan start signal and the output signal of the previous stage; and
- a discharging control section controlling the discharging section based on one of the scan start signal, the output signal of the previous stage, and charges stored in the second charging section,
- wherein the charging control section includes a plurality of transistors connected in series, gate electrodes of the transistors electrically connected to a drain electrode of a first transistor within the charging control section and receive the output signal of the next stage, and a source electrode of a last transistor within the charging control section electrically connected to the first charging section.

27. The gate driving circuit of claim 23, further comprising:
- a second charging section, the second charging section charging the output signal of the previous stage when the output signal of the previous stage is applied to the buffering section;
- a discharging section discharging one of the scan start signal and the output signal of the previous stage; and
- a discharging control section controlling the discharging section based on one of the scan start signal, the output signal of the previous stage, and charges stored in the second charging section,
- wherein the discharging control section includes a plurality of transistors connected in series, the output signal of the previous stage applied to the gate electrodes of the transistors, a drain electrode of a first transistor within the discharging control section electrically connected to a second source voltage, and a source electrode of a last transistor within the discharging control section electrically connected to the first charging section.

28. A display panel comprising:
- a cell array circuit formed on a substrate, the cell array circuit including a plurality of data lines and a plurality of gate lines; and
- a gate driving circuit formed on the substrate, the gate driving circuit comprising a plurality of stages, each of the stages applying an output signal to the gate lines in sequence, each of the stages comprising:
  - a buffering section receiving one of a scan start signal and an output signal of a previous stage;
  - a driving section generating the output signal of a present stage, when the buffering section receives one of the scan start signal and the output signal of the previous stage;
  - a first charging section including a first terminal electrically connected to the driving section and a second terminal electrically connected to a first source voltage; and
  - a charging control section applying the output signal of a next stage to the first charging section.

29. The display panel of claim 28, wherein the cell array circuit comprises:
- a switching device electrically connected to one of the data lines and one of the gate lines; and
- a liquid crystal capacitor including a pixel electrode electrically connected to the switching device, and a common electrode having a DC voltage applied thereto.

30. A method of minimizing a gradual failure of a first transistor within a discharging section and a second transistor within a driving section of a unit stage of a shift register, the method comprising:
- connecting gate electrodes of the first and second transistors to a node;
- providing a charging control section with a plurality of sub transistors connected in series to each other;
- connecting a source electrode of a final sub transistor in the plurality of sub transistors within the charging control section to the node;
- providing a discharging control section with a plurality of sub transistors connected in series to each other; and,
- connecting a drain electrode of a first sub transistor in the plurality of sub transistors within the discharging control section to the node.

31. The method of claim 30, further comprising electrically connecting a charging section between the node and a first source voltage.

32. The method of claim 30, further comprising dropping an output signal from the charging control section by an amount of a sum of threshold voltages of the sub transistors within the charging control section, and applying a dropped output signal to the node.

33. The method of claim 30, further comprising applying one of a scan start signal and an output signal of a previous stage to the discharging control section, turning on the sub transistors within the discharging control section, and pulling down a voltage of the node to a first source voltage.

* * * * *